US010755623B2

(12) United States Patent
Gou et al.

(10) Patent No.: US 10,755,623 B2
(45) Date of Patent: Aug. 25, 2020

(54) LED DISPLAY DEVICE

(71) Applicant: LEYARD OPTOELECTRONIC CO., LTD., Beijing (CN)

(72) Inventors: Jianzhou Gou, Beijing (CN); Xuechao Sun, Beijing (CN); Binglei Duan, Beijing (CN); Yu Zhao, Beijing (CN)

(73) Assignee: LEYARD OPTOELECTRONIC CO., LTD., Beijing (CN)

( * ) Notice: Subject to any disclaimer, the term of this patent is extended or adjusted under 35 U.S.C. 154(b) by 0 days.

(21) Appl. No.: 16/237,277

(22) Filed: Dec. 31, 2018

(65) Prior Publication Data

US 2019/0295459 A1 Sep. 26, 2019

(30) Foreign Application Priority Data

Mar. 23, 2018 (CN) .......................... 2018 1 0247699

(51) Int. Cl.

| | |
|---|---|
| ***G09G 3/32*** | (2016.01) |
| ***G09F 9/33*** | (2006.01) |
| ***H05K 5/00*** | (2006.01) |
| ***G09F 9/302*** | (2006.01) |

(52) U.S. Cl.

CPC ............. *G09G 3/32* (2013.01); *G09F 9/3026* (2013.01); *G09F 9/33* (2013.01); *H05K 5/0017* (2013.01)

(58) Field of Classification Search

CPC ............ G09G 3/32; G09F 9/3026; G09F 3/33
USPC ............................................................ 345/82
See application file for complete search history.

(56) References Cited

U.S. PATENT DOCUMENTS

| | | | | |
|---|---|---|---|---|
| 9,778,468 B2 * | 10/2017 | Yang | .................. | G02B 27/0176 |
| 9,832,415 B2 * | 11/2017 | Zhang | .................... | F16M 11/38 |
| 2008/0055106 A1 * | 3/2008 | Zhang | ..................... | G09F 13/22 340/815.45 |
| 2012/0069556 A1 * | 3/2012 | Bertram | .................. | F21V 23/02 362/217.14 |

(Continued)

FOREIGN PATENT DOCUMENTS

| | | |
|---|---|---|
| CN | 107038957 A | 8/2017 |
| CN | 206805944 U | 12/2017 |
| KR | 101043987 B1 | 6/2011 |

OTHER PUBLICATIONS

EP Extended Search Report dated Jul. 23, 2019 re: Application No. 18248229.9, pp. 1-10, citing: CN 107 038 957 A, CN 206 805 944 U and KR 101 043 987 B1.

*Primary Examiner* — Calvin C Ma
(74) *Attorney, Agent, or Firm* — Cantor Colburn LLP

(57) ABSTRACT

An LED display device includes a front box body and a rear box body connected to each other; a display module, disposed on the front box body; and a first connecting structure, disposed between the front box body and the rear box body. The first connecting structure includes a rotating member, rotatably disposed on the front box body, the rotating member including a connecting column extending toward the rear box body; a positioning sleeve, detachably disposed on the connecting column, a position adjusting mechanism being disposed between the positioning sleeve and the connecting column; and a receiving recess and a locking member, the receiving recess being disposed on the rear box body, the positioning sleeve being disposed in the receiving recess, and the locking member being disposed on the rear box body and located between the receiving recess and the positioning sleeve.

12 Claims, 12 Drawing Sheets

(56) References Cited

U.S. PATENT DOCUMENTS

2015/0355610 A1* 12/2015 Petrocy .............. G05B 19/0421
700/20

* cited by examiner

LED DISPLAY DEVICE

CROSS REFERENCE TO RELATED APPLICATIONS

This application is related to, and claims the benefit of, Chinese Patent Application No. 201810247699.X, filed on Mar. 23, 2018, the contents of which are herein incorporated by reference in their entirety.

TECHNICAL FIELD

The present disclosure relates to the technical field of display devices, and more particularly to an LED display device.

BACKGROUND

An LED display screen has become a new favorite in the current display field due to its advantages such as ultra-high definition display, high brightness, low gray level, low power consumption and long service life, which are unmatched by traditional display devices such as liquid crystal screens and projectors. It has been widely used in conference rooms, clubs, shopping malls, studios, and monitoring halls.

The pre-maintenance mode of the existing LED display products is mainly to fasten an LED lamp panel and a box by screws. When the LED lamp panel is disassembled, the LED lamp panel must be removed from the front of a display screen by using a screwdriver, so as to remove parts such as a power supply and a control panel on the back of a lamp panel for pre-maintenance. The maintenance mode requires a large number of fastening screws between the module and the box, which makes the maintenance time-consuming and laborious and easily damages lamp beads on the surface of the lamp panel during maintenance.

In order to solve the above problems in the LED display screen, the applicant discloses a magnetic torque stepless adjusting assembly, an adjusting tool and a display device in the Chinese patent application No. 201720417231.1. As shown in FIG. 1, a rotatable adjusting screw 1 is disposed on the inner side of an LED lamp panel, a connecting threaded hole 3 is disposed at a position corresponding to a box, and a magnetic member 2 is connected to the front end of the adjusting screw 1. At the time of mounting, the rear end of the adjusting screw 1 is aligned with the connecting threaded hole 3, and an operator holds a magnetic adjusting tool 4 which is disposed corresponding to the magnetic member 2. The magnetic adjusting tool 4 is provided with a magnetic member and is capable of attracting the magnetic member 2. When the magnetic adjusting tool 4 is rotated, the adjusting screw 1 can be rotated synchronously, so that the rear end of the adjusting screw 1 is screwed into the connecting threaded hole. The above structure can be independent of an LED dot pitch to achieve the pre-maintenance function. Furthermore, the flatness of the LED lamp panel can be adjusted by rotating the magnetic adjusting tool 4. However, the above structure has the following problems:

when the LED lamp panel and the box are connected, the adjusting screw 1 and the connecting threaded hole 3 need to be completely aligned, and then the magnetic adjusting tool 4 is rotated, so that the operation efficiency of the operator is low. Furthermore, the adjusting screw 1 and the connecting threaded hole 3 are susceptible to manufacturing errors, resulting in non-alignment, so that the LED lamp panel cannot be assembled normally.

SUMMARY

The present disclosure is mainly directed to an LED display device, intended to solve the problems in the conventional art that a pre-maintenance LED display screen cannot adjust a joint seam and flatness between display units, the display unit has low mounting and maintenance efficiency, the assembly is susceptible to manufacturing errors, and pre-maintenance cannot be performed under the restriction of a dot pitch.

In order to achieve the above objective, the present disclosure provides an LED display device, which may include: a front box body and a rear box body connected to each other; a display module, disposed on the front box body; and a first connecting structure, disposed between the front box body and the rear box body, the first connecting structure including: a rotating member, rotatably disposed on the front box body, the rotating member including a connecting column extending toward the rear box body; a positioning sleeve, detachably disposed on the connecting column, a position adjusting mechanism being disposed between the positioning sleeve and the connecting column, wherein when the positioning sleeve rotates relative to the connecting column, the position adjusting mechanism can adjust an axial relative position between the positioning sleeve and the connecting column; and a receiving recess and a locking member, the receiving recess being disposed on the rear box body, the positioning sleeve being disposed in the receiving recess, and the locking member being disposed on the rear box body and located between the receiving recess and the positioning sleeve, wherein when the locking member fits the positioning sleeve, the locking member limits the circumferential rotation and axial movement of the positioning sleeve in the receiving recess, and when the locking member is separated from the positioning sleeve, the positioning sleeve can be disengaged from the receiving recess.

In an embodiment, a side wall of the receiving recess may be provided with a first mounting through hole, an outer side wall of the positioning sleeve may be provided with a positioning groove, the locking member may include a locking pin, and the locking pin may pass through the first mounting through hole and then may be clamped in the positioning groove.

In an embodiment, the positioning groove may extend along the circumference of the positioning sleeve.

In an embodiment, the position adjusting mechanism may include a first screw thread section disposed on the connecting column and a second screw thread section disposed on an inner side wall of the positioning sleeve.

In an embodiment, the first connecting structure may further include: a fixed plate, fixedly disposed on the front box body, the fixed plate being provided with a second mounting through hole; and a rotating head, the rotating head being located on a side, away from the rear box body, of the fixed plate, the rotating head having a reducing section, the reducing section being inserted into the second mounting through hole, and the rotating head being provided with a magnetic member, where the connecting column is provided with a positioning convex edge, the connecting column is connected to the reducing section, and the positioning convex edge is clamped on a side, facing the rear box body, of the fixed plate.

In an embodiment, a first magnetic attraction mechanism may be disposed between the positioning sleeve and the receiving recess.

In an embodiment, the LED display device may further include an adjusting frame, wherein the rear box body is detachably disposed on the adjusting frame, and a horizontal position adjusting mechanism and a vertical position adjusting mechanism are disposed between the adjusting frame and the rear box body.

In an embodiment, the horizontal position adjusting mechanism may include: a first adjusting hole, disposed on a side of the rear box body; a second adjusting hole, disposed on a side of the adjusting frame, the second adjusting hole being a threaded hole, and the second adjusting hole being located inside the first adjusting hole; and a first adjusting bolt, inserted into the first adjusting hole and the second adjusting hole, where the first adjusting hole is a long hole extending in a width direction of the rear box body.

In an embodiment, the vertical position adjusting mechanism may include: a third adjusting hole, disposed on an upper edge of the rear box body; and a second adjusting bolt, the second adjusting bolt being inserted into the third adjusting hole, and the lower end of the second adjusting bolt urging against the adjusting frame.

In an embodiment, a second connecting structure may be disposed between the adjusting frame and the rear box body.

Further, the second connecting structure may include: a first connecting hole, disposed on the rear box body, the first connecting hole being a threaded hole; a second connecting hole, disposed on the adjusting frame; and a connecting bolt, inserted into the first connecting hole and the second connecting hole, where the diameter of the second connecting hole is greater than the diameter of the first connecting hole.

In an embodiment, a second magnetic attraction mechanism may be disposed between the rear box body and the adjusting frame.

According to the technical solution of the present disclosure, when assembling the front box body and the rear box body, the connecting column and the positioning sleeve are first connected together, and then the positioning sleeve is received in the receiving recess. The positioning sleeve is locked in the receiving recess by the locking member, and the relative position between the connecting column and the positioning sleeve is changed by rotating the rotating member, thereby disassembling the front box body or adjusting the flatness of the display module. In the above structure, since a threaded structure is not present between the receiving recess and the positioning sleeve, the positioning sleeve can be easily inserted into the receiving recess, that is, the front box body and the rear box body can be quickly aligned for mounting, thereby improving the assembly efficiency. Furthermore, the precision requirement between the positioning sleeve and the receiving recess is reduced, and the production process difficulty is reduced. Therefore, the technical solution of the present disclosure solves the problems in the conventional art that the LED display device has low assembly efficiency and the assembly is susceptible to manufacturing errors.

BRIEF DESCRIPTION OF THE DRAWINGS

The accompanying drawings, which constitute a part of this application, are used to provide a further understanding of the present disclosure, and the exemplary embodiments of the present disclosure and the description thereof are used to explain the present disclosure, but do not constitute improper limitations to the present disclosure. In the drawings.

Figure 1:
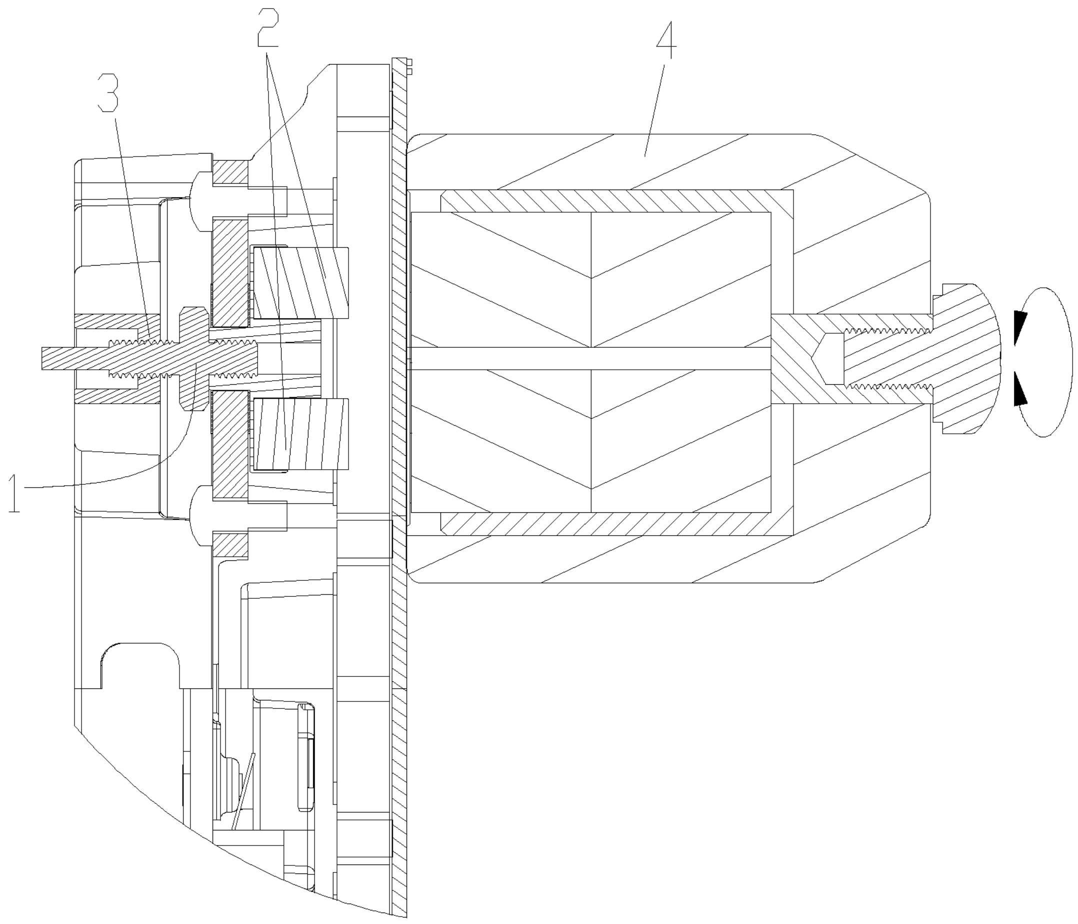
FIG. 1 is a schematic diagram showing a connection manner between a lamp panel and a box of an LED display device in the conventional art.
Figure 2:
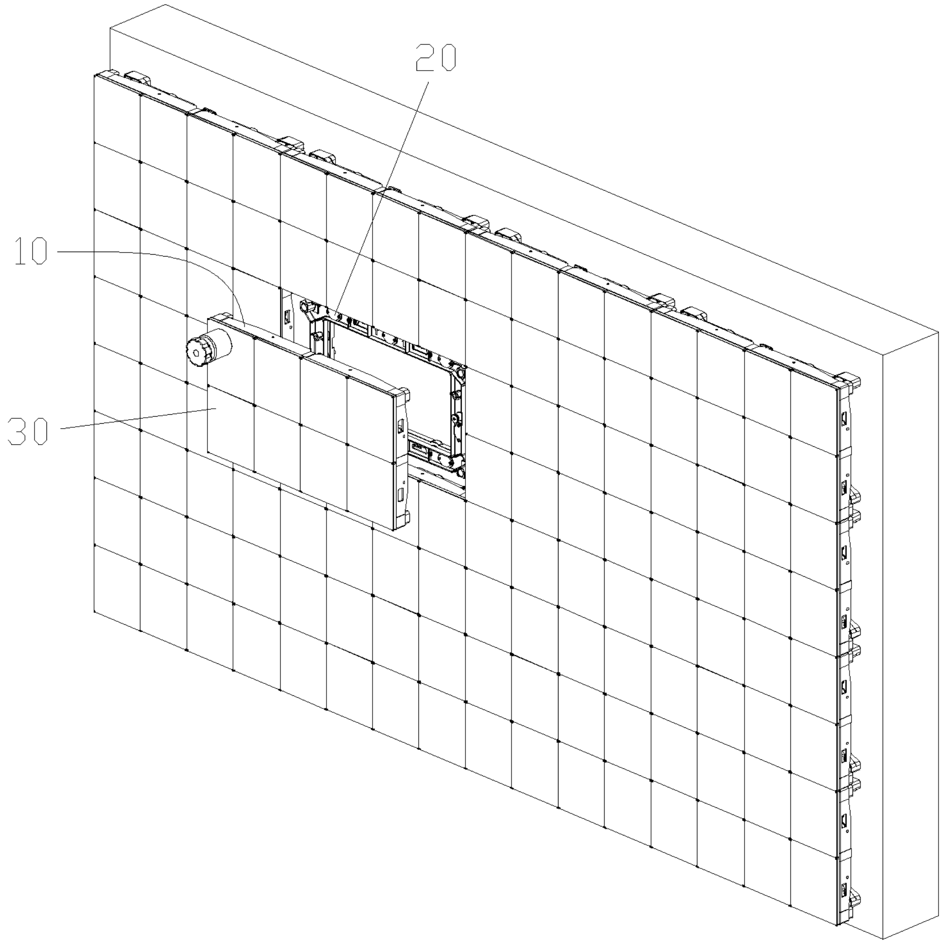
FIG. 2 is a schematic stereogram showing the front side of an embodiment of an LED display device according to the present disclosure.

The drawings include the following reference signs:

adjusting screw 1, magnetic member 2, connecting threaded hole 3, magnetic adjusting tool 4, front box body 10, rear box body 20, display module 30, first connecting structure 40, rotating member 41, connecting column 411, positioning convex edge 412, positioning sleeve 42, positioning groove 421, receiving recess 43, first mounting through hole 431, locking member 44, fixed plate 45, second mounting through hole 451, rotating head 46, reducing section 461, adjusting mechanism 50, adjusting frame 60, horizontal position adjusting mechanism 70, first adjusting hole 71, second adjusting hole 72, first adjusting bolt 73, vertical position adjusting mechanism 80, third adjusting hole 81, second adjusting bolt 82, second connecting structure 90, first connecting hole 91, second connecting hole 92, connecting bolt 93.

DETAILED DESCRIPTION OF THE DRAWINGS

It is to be noted that embodiments in the present application and characteristics in the embodiments may be combined under the condition of no conflicts. The present disclosure is described below with reference to the drawings and in conjunction with the embodiments in detail.

The technical solutions in the embodiments of the present application will be clearly and completely described hereinbelow with the drawings in the embodiments of the present application. It is apparent that the described embodiments are only part of the embodiments of the present application, not all of the embodiments. The following description of at least one exemplary embodiment is only illustrative actually, and is not used as any limitation for the present application and the application or use thereof. On the basis of the embodiments of the present application, all other embodiments obtained on the premise of no creative work of those skilled in the art fall within the scope of protection of the present application.

It is to be noted that terms used herein only aim to describe specific implementation manners, and are not intended to limit exemplar implementations of this application. Unless otherwise directed by the context, singular forms of terms used herein are intended to include plural forms. Besides, it will be also appreciated that when terms "contain" and/or "include" are used in the description, it is indicated that features, steps, operations, devices, assemblies and/or a combination thereof exist.

As shown in FIG. 2, FIG. 3, and FIG. 8 to FIG. 10, the LED display device of the present embodiment includes a front box body 10 and a rear box body 20 connected to each other, a display module 30, and a first connecting structure 40. The display module 30 is disposed on the front box body 10. The first connecting structure 40 is disposed between the front box body 10 and the rear box body 20. Further, the first connecting structure 40 includes a rotating member 41, a positioning sleeve 42, a receiving recess 43, and a locking member 44. The rotating member 41 is rotatably disposed on the front box body 10, the rotating member 41 including a connecting column 411 extending toward the rear box body 20. The positioning sleeve 42 is detachably disposed on the connecting column 411, and a position adjusting mechanism 50 is disposed between the positioning sleeve 42 and the connecting column 411. The position adjusting structure is configured as that: when the positioning sleeve 42 rotates relative to the connecting column 411, the position adjusting mechanism 50 can adjust an axial relative position between the positioning sleeve 42 and the connecting column 411. The receiving recess 43 is disposed on the rear box body 20, the positioning sleeve 42 is disposed in the receiving recess 43, and the locking member 44 is disposed between the receiving recess 43 and the positioning sleeve 42. Further, when the locking member 44 fits the positioning sleeve 42, the locking member 44 limits the circumferential rotation and axial movement of the positioning sleeve 42 in the receiving recess 43, and when the locking member 44 is separated from the positioning sleeve 42, the positioning sleeve 42 can be disengaged from the receiving recess 43.

According to the technical solution of the present embodiment, when assembling the front box body 10 and the rear box body 20, the connecting column 411 and the positioning sleeve 42 are first connected together, and then the positioning sleeve 42 is received in the receiving recess 43. The positioning sleeve 42 is locked in the receiving recess 43 by the locking member 44, and the relative position between the connecting column 411 and the positioning sleeve 42 is changed by rotating the rotating member 41, thereby disassembling the front box body 10 or adjusting the flatness of the display module 30. In the above structure, since a threaded structure is not present between the receiving recess 43 and the positioning sleeve 42, the positioning sleeve 42 can be easily inserted into the receiving recess 43, that is, the front box body 10 and the rear box body 20 can be quickly aligned for mounting, thereby improving the assembly efficiency. Furthermore, the precision requirement between the positioning sleeve 42 and the receiving recess 43 is reduced, and the production process difficulty is reduced. Therefore, the technical solution of the present embodiment solves the problems in the conventional art that a joint seam and flatness between display units cannot be adjusted, the display unit has low mounting and maintenance efficiency, and the assembly is susceptible to manufacturing errors.

Further, in the present application, after the connecting column 411 is rotated and the connecting column 411 and the positioning sleeve 42 are separated, the front box body 10 can be detached from the rear box body 20, thereby maintaining and replacing the structure inside the box. The above structure enables the LED display device of the present application to achieve pre-disassembly of the box level, thereby improving the efficiency of the maintenance operation.

Figure 8:
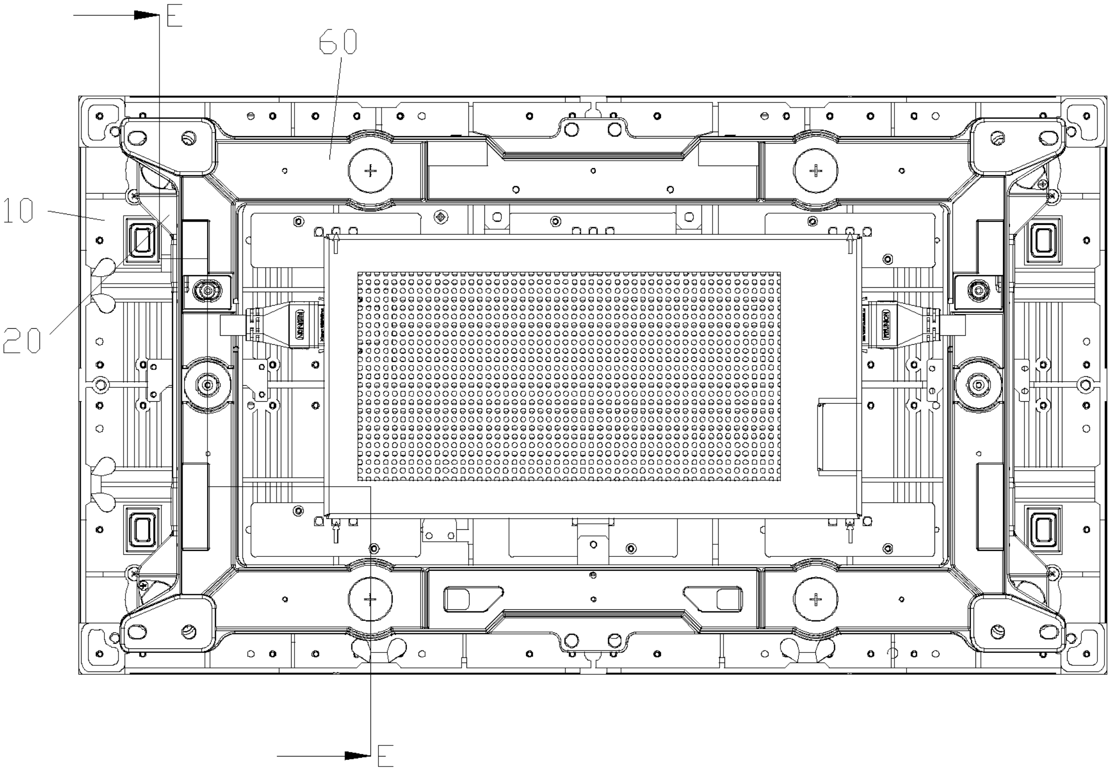
FIG. 8 shows a schematic back view of the display device in FIG. 2.
Figure 9:
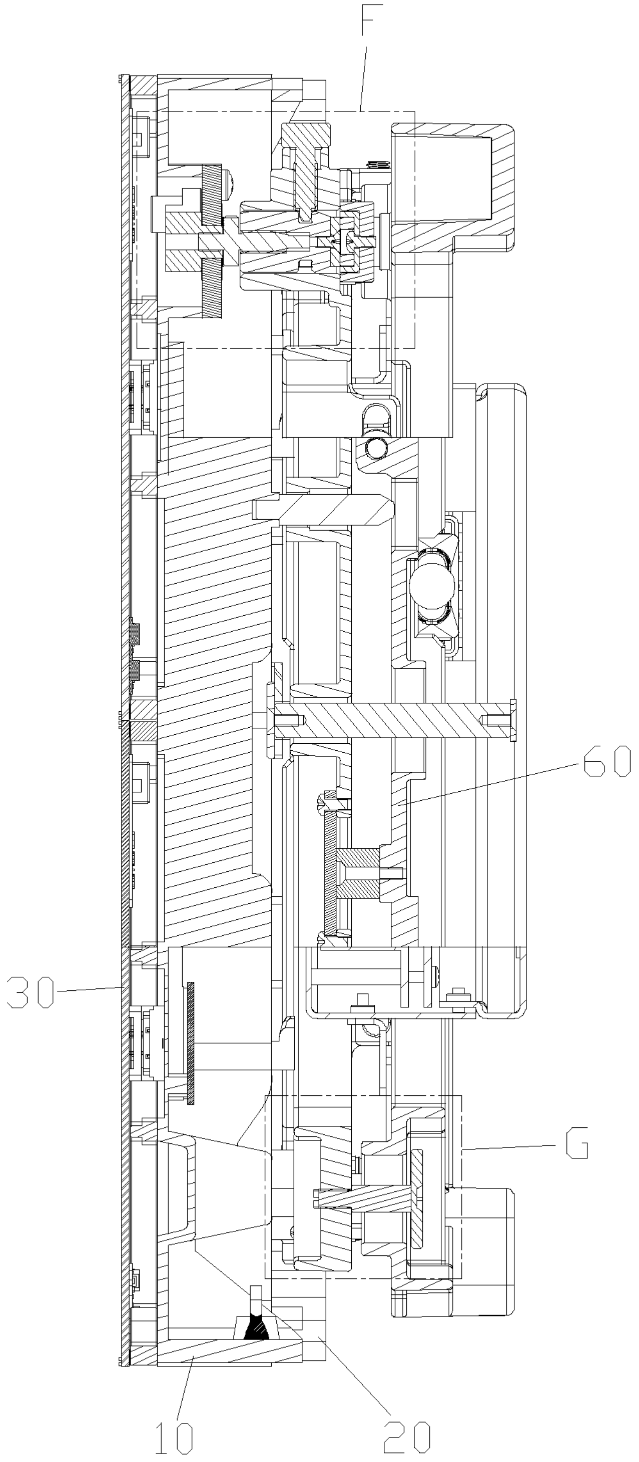
FIG. 9 shows a schematic E-E direction section view of the display device in FIG. 2.
Figure 10:
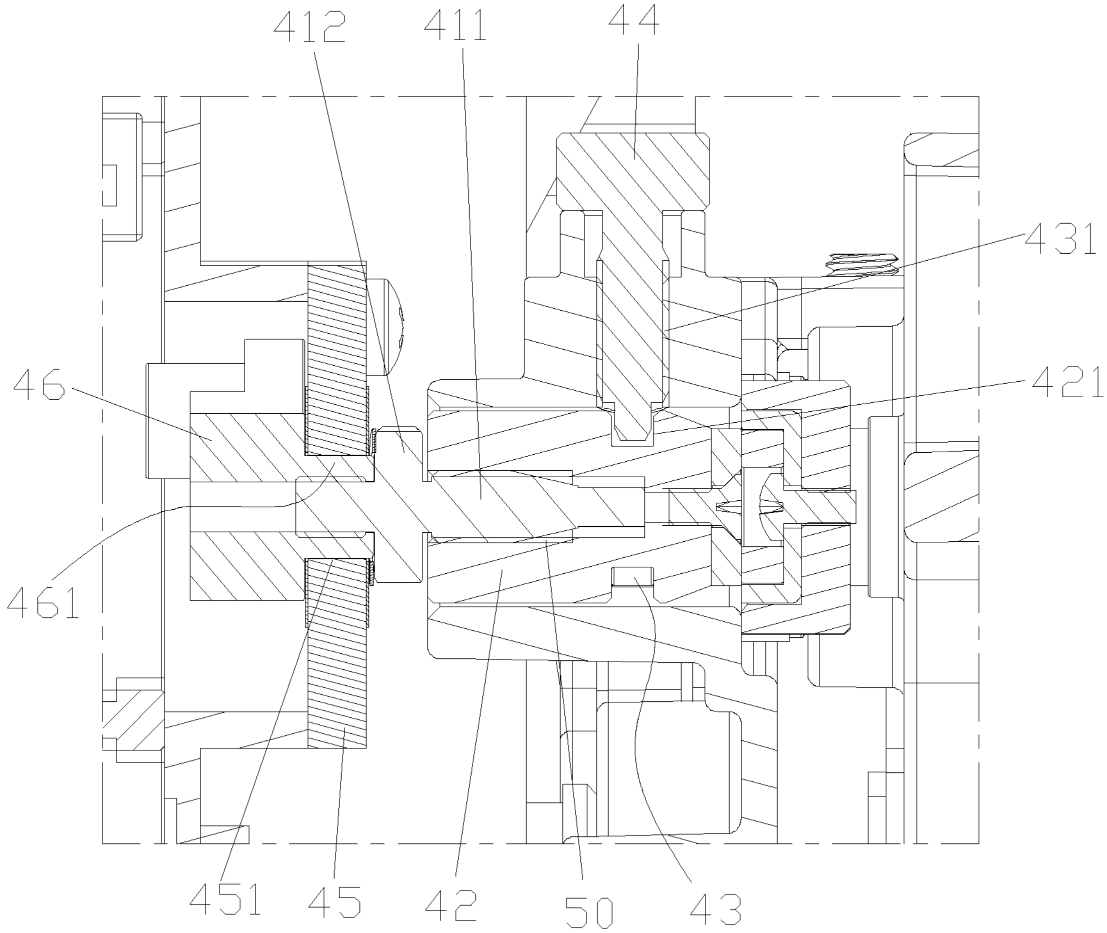
FIG. 10 shows a schematic enlarged view of F in FIG. 9.

As shown in FIG. 8 to FIG. 10, in the technical solution of the present embodiment, a side wall of the receiving recess 43 is provided with a first mounting through hole 431, an outer side wall of the positioning sleeve 42 is provided with a positioning groove 421, the locking member 44 includes a locking pin, and the locking pin passes through the first mounting through hole 431 and then is clamped in the positioning groove 421. Specifically, during the assembly operation of the front box body, the positioning sleeve 42 is inserted into the receiving recess 43, and then the positioning pin passes through the first mounting through hole 431 and is clamped in the positioning groove 421. At this time, the positioning sleeve 42 cannot be detached from the receiving recess 43 in the axial direction, and the positioning sleeve 42 cannot be rotated in the circumferential direction in the receiving recess 43 (or the positioning sleeve 42 can only be rotated within a certain angular range and then stuck by the positioning pin). Therefore, the front box body 10 is fixed to the rear box body 20.

Further, after the positioning sleeve 42 is fixed in the receiving recess 43, the rotating member 41 is rotated. At this time, the connecting column 411 and the positioning sleeve 42 are under the action of the position adjusting mechanism 50, and the relative position between the connecting column 411 and the positioning sleeve 42 is changed. Since the positioning sleeve 42 is fixed by the locking pin, the connecting column 411 can move in the axial direction, that is, a gap between the front box body 10 and the rear box body 20 is adjusted, thereby adjusting the flatness of the display module 30. Further, as can be seen from FIG. 3, the present application arranges a first connecting structure 40 at the positions of the four corners of the front box body 10 and the rear box body 20, and thus the positions of the four corners of the front box body 10 can be finely adjusted.

When the front box body 10 needs to be removed and the display module 30 is maintained, the positioning pin is unscrewed from the first mounting through hole 431, and the positioning sleeve 42 can be taken out from the receiving recess, thereby detaching the front box body 10 from the rear box body 20. Further, after the front box body 10 is detached, the parts provided in the rear box body 20 can be maintained and replaced.

Figure 3:
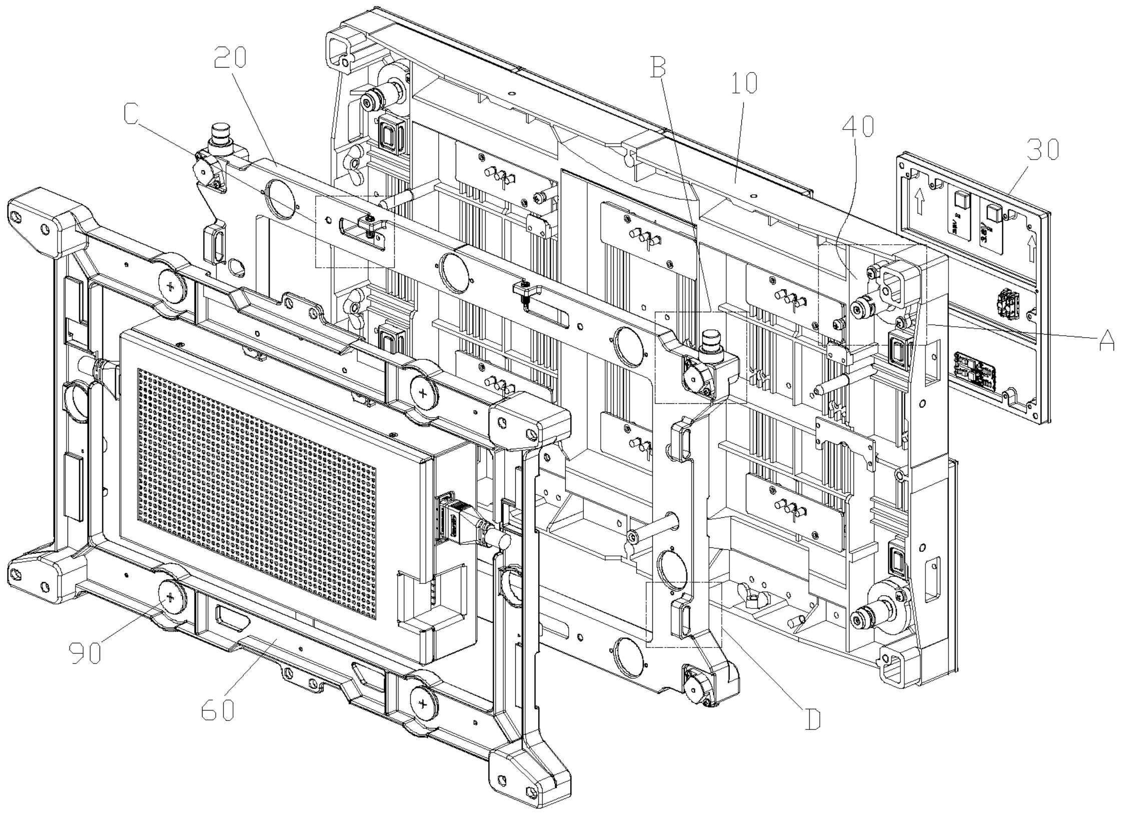
FIG. 3 shows a schematic exploded view of the LED display device in FIG. 2.
Figure 4:
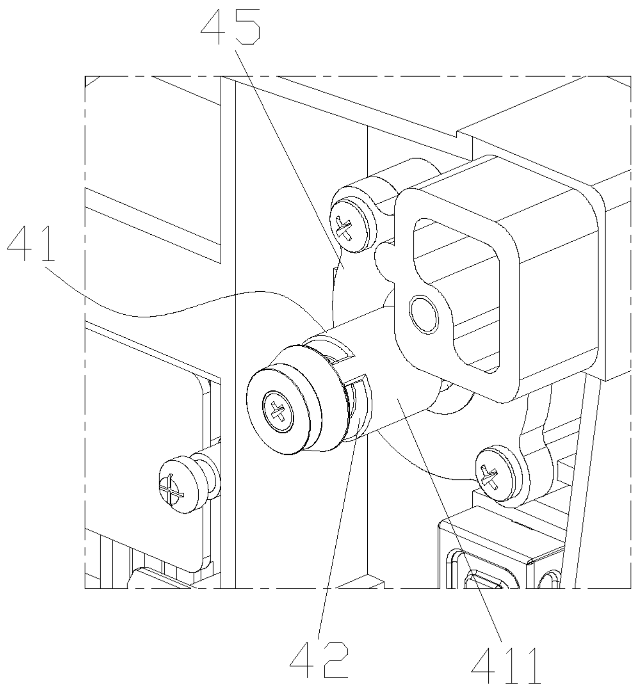
FIG. 4 shows a schematic enlarged view of part A in FIG. 3.

As shown in FIG. 3 and FIG. 4, in the technical solution of the present embodiment, the positioning groove 421 extends in the circumferential direction of the positioning sleeve 42. Specifically, the above structure enables the positioning pin to be more easily clamped in the positioning groove 421, thereby simplifying the alignment operation. In the above structure, since the positioning groove 421 extends in the circumferential direction of the positioning sleeve 42, when the positioning pin is inserted into the positioning groove 421, the positioning sleeve 42 can be rotated in the circumferential direction within a certain range. However, after the positioning pin urges against the end of the positioning groove 421 when the positioning sleeve 42 rotates, the positioning sleeve 42 can no longer continue to rotate, thereby restricting the circumferential rotation of the positioning sleeve 42.

Figure 5:
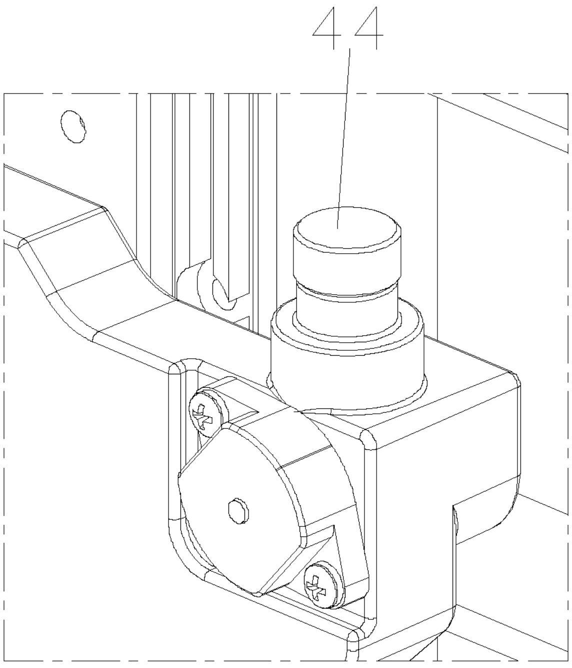
FIG. 5 shows a schematic enlarged view of part B in FIG. 3.

As shown in FIG. 5 and FIG. 10, in the technical solution of the present embodiment, in order to ensure that the positioning pin can be fixed and stabilized, a thread and spring structure is disposed between the positioning pin and the first mounting through hole 431. An operator can rotate the end of the positioning pin to control whether the positioning pin is embedded in the positioning groove 421.

As shown in FIG. 10, in the technical solution of the present embodiment, the position adjusting mechanism 50 includes a first screw thread section disposed on the connecting column 411 and a second screw thread section disposed on an inner side wall of the positioning sleeve 42. Specifically, since the positioning sleeve 42 is fixed by the positioning pin, the connecting column 411 can axially move relative to the positioning sleeve 42 by the first screw thread section and the second screw thread section as the rotating member 41 rotates. Of course, the structure of the adjusting mechanism 50 is not limited to the first screw thread section and the second screw thread section. For example, the adjusting mechanism 50 may be: the connecting column 411 is provided with a rib, and the inner side wall of the positioning sleeve 42 is provided with a spiral groove structure corresponding thereto.

As shown in FIG. 10, in the technical solution of the present embodiment, the first connecting structure 40 further includes a fixed plate 45 and a rotating head 46. The fixed plate 45 is fixedly disposed on the front box body 10, the fixed plate 45 being provided with a second mounting through hole 451. The rotating head 46 is located on a side, away from the rear box body 20, of the fixed plate 45, the rotating head 46 having a reducing section 461, and the reducing section 461 being inserted into the second mounting through hole. The rotating head 46 is provided with a magnetic member. The connecting column 411 is provided with a positioning convex edge 412, the connecting column 411 is connected to the reducing section 461, and the positioning convex edge 412 is clamped on a side, facing the rear box body 20, of the fixed plate 45. In the present embodiment, the fixed plate 45 is fixed to the front box body 10 by screwing. The operator rotates the rotating head 46 under the action of a magnetic torque by rotating an external magnetic tool, thereby driving the connecting column 411 to rotate.

As shown in FIG. 10, in the technical solution of the present embodiment, a first magnetic attraction mechanism is disposed between the positioning sleeve 42 and the receiving recess 43. Specifically, the first magnetic attraction structure can provide an auxiliary mounting force while also achieving the effect of aligning between the positioning sleeve 42 and the receiving recess 43.

Figure 6:
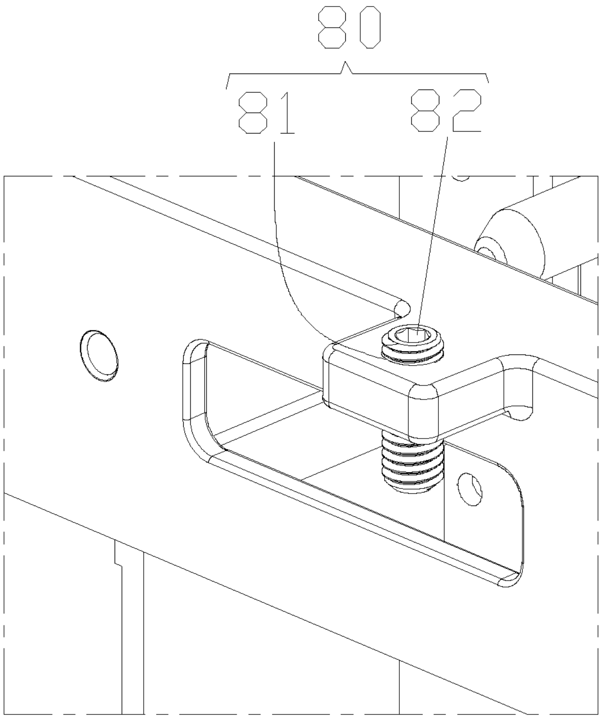
FIG. 6 shows a schematic enlarged view of part C in FIG. 3.
Figure 7:
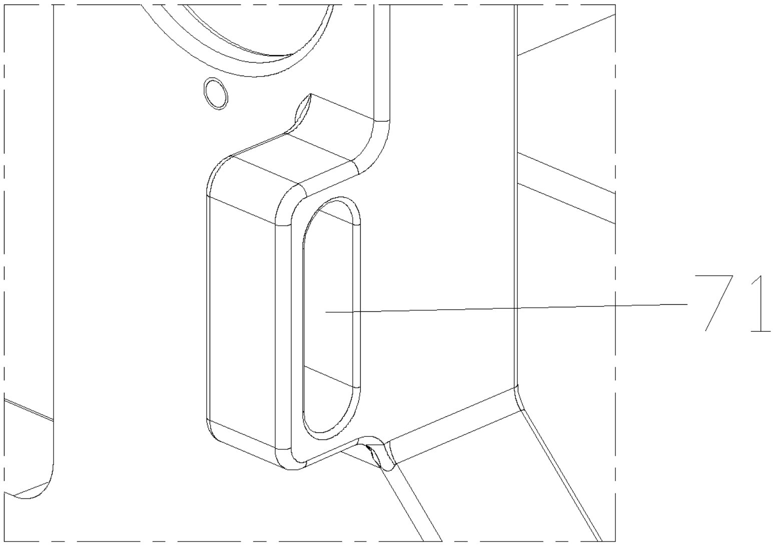
FIG. 7 shows a schematic enlarged view of part D in FIG. 3.

As shown in FIG. 3, FIG. 6 and FIG. 7, in the technical solution of the present embodiment, the LED display device further includes an adjusting frame 60, wherein the rear box body 20 is detachably disposed on the adjusting frame 60, and a horizontal position adjusting mechanism 70 and a vertical position adjusting mechanism 80 are disposed between the adjusting frame 60 and the rear box body 20. Specifically, the position of the rear box body in the up, down, left, and right directions in the horizontal direction can be adjusted by the horizontal position adjusting mechanism 70 and the vertical position adjusting mechanism 80, and the first connecting structure 40 can adjust the position of the front box body 10 in the front and rear directions. That is to say, in the present application, the three-axis six-direction position adjustment of the display module 30 can be performed to achieve a perfect splicing effect.

Figure 12:
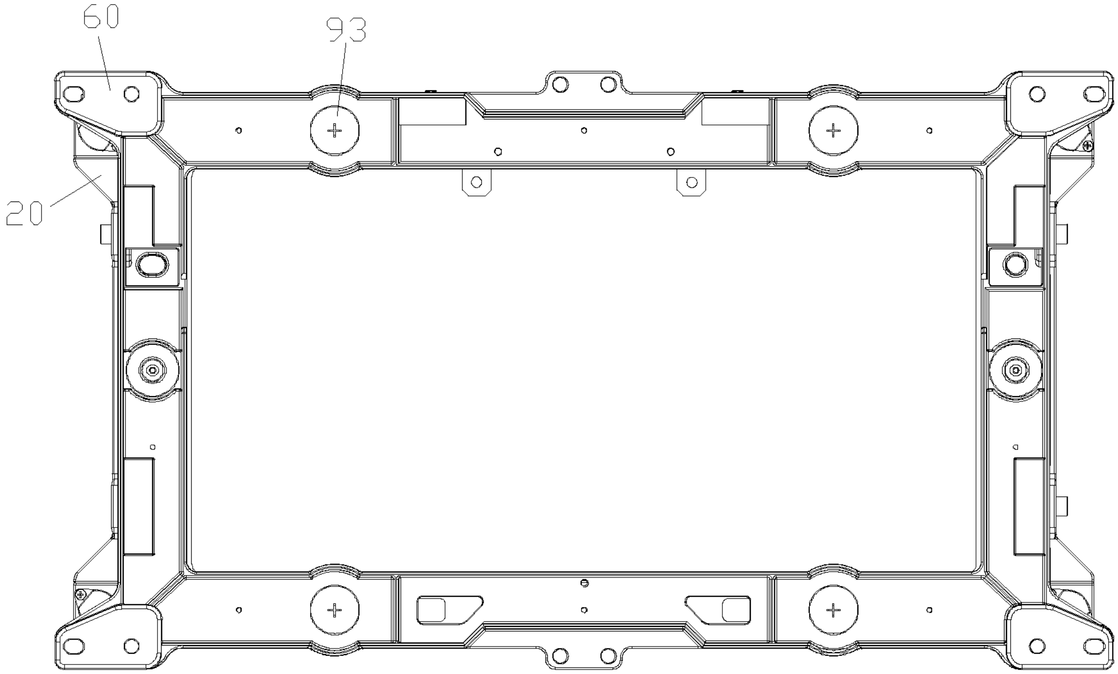
FIG. 12 shows a schematic structure diagram of a rear box body and an adjusting frame of the display device in FIG. 2.
Figure 13:
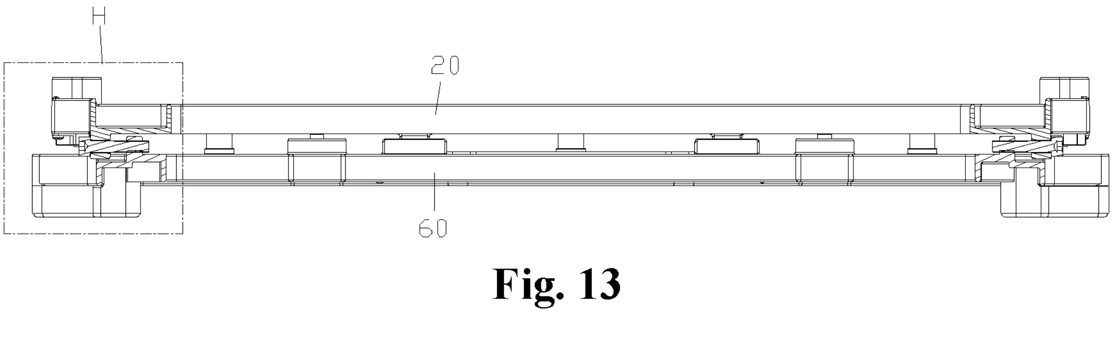
FIG. 13 shows a schematic top view of the display device in FIG. 12.
Figure 14:
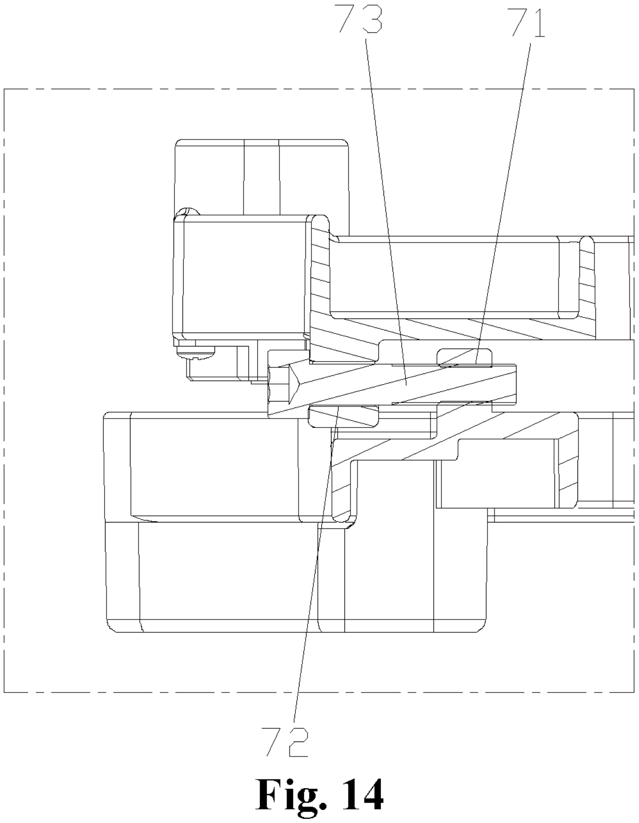
FIG. 14 shows a schematic enlarged view of H in FIG. 13.

As shown in FIG. 7, FIG. 12 and FIG. 14, in the technical solution of the present embodiment, the horizontal position adjusting mechanism 70 includes a first adjusting hole 71, a second adjusting hole 72 and a first adjusting bolt 73. The first adjusting hole 71 is disposed on a side of the rear box body (20). The second adjusting hole 72 is disposed on a side of the adjusting frame (60), the second adjusting hole 72 being a threaded hole, and the second adjusting hole 72 being located inside the first adjusting hole 71. The first adjusting bolt 73 is inserted into the first adjusting hole 71 and the second adjusting hole 72, wherein the first adjusting hole 71 is a long hole extending in a width direction of the rear box body 20. Specifically, the present application arranges a horizontal position adjusting mechanism 70 on both sides of the rear box body 20 and the adjusting frame 60. It will be understood by those skilled in the art that the adjustment to the right side can be achieved when the first adjusting bolt 73 on the left side is unscrewed and the first adjusting bolt 74 on the right side is tightened. On the contrary, the adjustment to the left side can be realized. Preferably, in order to prevent interference between the structures when the rear box body 20 is adjusted up and down, and the first adjusting hole 71 is a long hole extending in a width direction of the rear box body 20. When the rear box body 20 moves up and down, the first adjusting bolt 73 can slide in the first adjusting hole 71.

As shown in FIG. 6, in the technical solution of the present embodiment, the vertical position adjusting mechanism 80 includes: a third adjusting hole 81, disposed on an upper edge of the rear box body 20; and a second adjusting bolt 82, the second adjusting bolt 82 being inserted into the third adjusting hole 81, and the lower end of the second adjusting bolt 82 urging against the adjusting frame 60. Specifically, when the second adjusting bolt 82 is rotated in the first direction, the second adjusting bolt moves downward relative to the rear box body 20 and the rear box body moves upward relative to the adjusting frame 60. When the second adjusting bolt 82 is rotated in the reverse direction, then the rear box body 20 falls under the action of gravity. Thus, the adjustment of the upper and lower directions of the box is realized.

Figure 11:
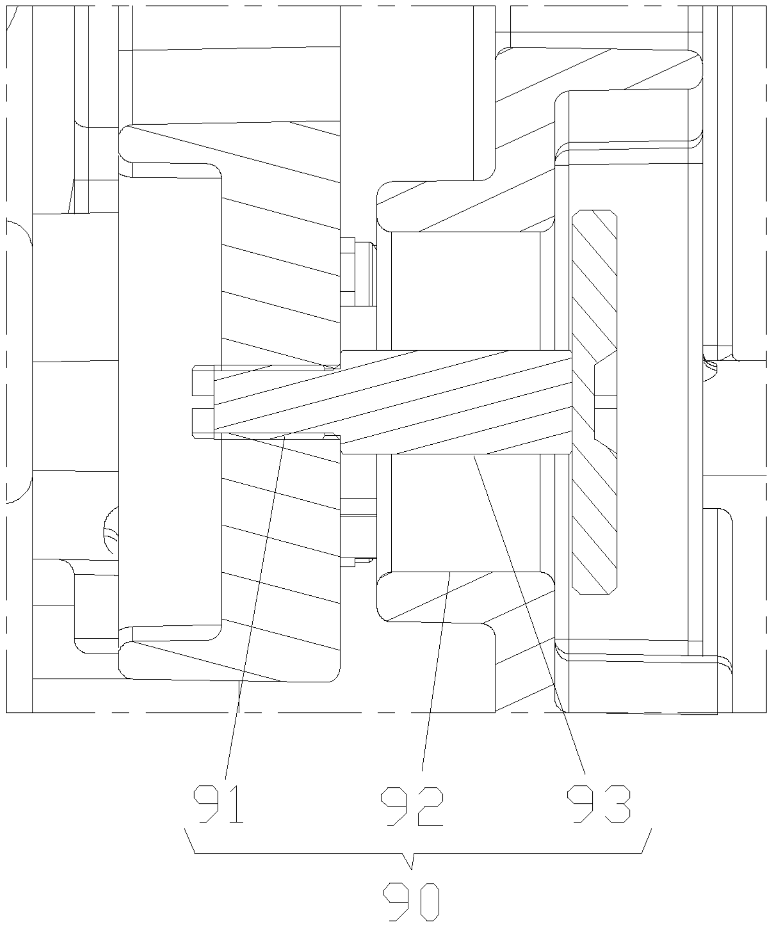
FIG. 11 shows a schematic enlarged view of G in FIG. 9.

As shown in FIG. 11 and FIG. 12, in the technical solution of the present embodiment, a second connecting mechanism 90 is disposed between the adjusting frame 60 and the rear box body 20. Specifically, the adjusting frame 60 is fixed to a wall or other structures. The adjusting frame 60 is connected to the rear box body 20 through the second connecting structure 90. When the box is adjusted in four directions of up, down, left and right, the connecting structure 90 can follow the rear box body 20 to move in the XOY plane relative to the adjusting frame 60, so as to achieve reliable adjustment in the above four directions.

As shown in FIG. 11 and FIG. 12, in the technical solution of the present embodiment, the second connecting structure 90 includes: a first connecting hole 91, disposed on the rear box body 20, the first connecting hole 91 being a threaded hole; a second connecting hole 92, disposed on the adjusting frame 60; and a connecting bolt 93, inserted into the first connecting hole 91 and the second connecting hole 92, wherein the diameter of the second connecting hole 92 is greater than the diameter of the first connecting hole 91, so that a rod portion of the connecting bolt 93 can move in the second connecting hole 92 to realize the adjustment of the box in the four directions of up, down, left and right.

Preferably, a second magnetic attraction mechanism is disposed between the rear box body 20 and the adjusting frame 60. The second magnetic attraction structure can serve to assist mounting.

Figure 15:
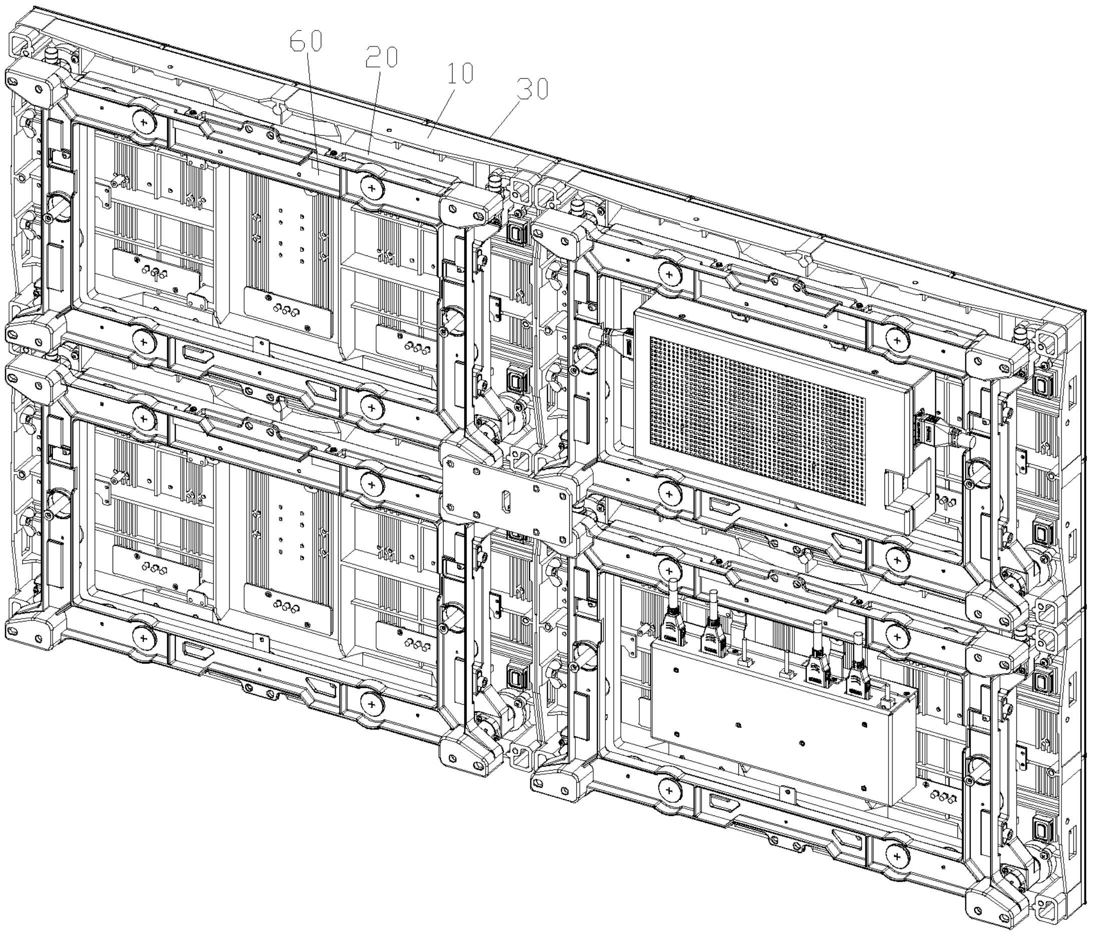
FIG. 15 shows a schematic structure diagram of splicing of multiple display devices in FIG. 2.

As shown in FIG. 15, in the technical solution of the present application, multiple LED display devices are spliced to form a complete display screen. The display module of each LED display device can realize three-axis six-direction position adjustment through the first connecting structure 40, the horizontal position adjusting mechanism 70 and the vertical position adjusting mechanism 80, thereby achieving a perfect splicing effect.

Unless otherwise specified, relative arrangements of components and steps elaborated in these embodiments, numeric expressions and numeric values do not limit the scope of the present application. Furthermore, it should be understood that for ease of descriptions, the size of each part shown in the drawings is not drawn in accordance with an actual proportional relation. Technologies, methods and devices known by those skilled in the related art may not be discussed in detail. However, where appropriate, the technologies, the methods and the devices shall be regarded as part of the authorized description. In all examples shown and discussed herein, any specific values shall be interpreted as only exemplar values instead of limited values. As a result, other examples of the exemplar embodiments may have different values. It is to be noted that similar marks and letters represent similar items in the following drawings. As a result, once a certain item is defined in one drawing, it is unnecessary to further discus the certain item in the subsequent drawings.

In the descriptions of the present application, it will be appreciated that locative or positional relations indicated by “front, back, up, down, left, and right”, “horizontal, vertical, perpendicular, and horizontal”, “top and bottom” and other terms are locative or positional relations shown on the basis of the drawings, which are only intended to make it convenient to describe the present application and to simplify the descriptions without indicating or impliedly indicating that the referring device or element must have a specific location and must be constructed and operated with the specific location, and accordingly it cannot be understood as limitations to the present application. The nouns of locality “inner and outer” refer to the inner and outer contours of each component.

For ease of description, spatial relative terms such as “over”, “above”, “on an upper surface” and “upper” may be used herein for describing a spatial position relation between a device or feature and other devices or features shown in the drawings. It will be appreciated that the spatial relative terms aim to contain different orientations in usage or operation besides the orientations of the devices described in the drawings. For example, if the devices in the drawings are inverted, devices described as “above other devices or structures” or “over other devices or structures” will be located as “below other devices or structures” or “under other devices or structures”. Thus, an exemplar term “above” may include two orientations namely “above” and “below”. The device may be located in other different modes (rotated by 90 degrees or located in other orientations), and spatial relative descriptions used herein are correspondingly explained.

In addition, it is to be noted that terms “first”, “second” and the like are used to limit parts, and are only intended to distinguish corresponding parts. If there are no otherwise statements, the above terms do not have special meanings, such that they cannot be understood as limits to the scope of protection of the present application.

The above is only the preferred embodiments of the present disclosure, not intended to limit the present disclosure. As will occur to those skilled in the art, the present disclosure is susceptible to various modifications and changes. Any modifications, equivalent replacements, improvements and the like made within the spirit and principle of the present disclosure shall fall within the scope of protection of the present disclosure.

What is claimed is:

1. An LED display device comprising:

a front box body and a rear box body connected to each other;

a display module, disposed on the front box body; and a first connecting structure, disposed between the front box body and the rear box body, the first connecting structure comprises:

a rotating member, rotatably disposed on the front box body, the rotating member comprising a connecting column extending toward the rear box body;

a positioning sleeve, detachably disposed on the connecting column, a position adjusting mechanism being disposed between the positioning sleeve and the connecting column, wherein when the positioning sleeve rotates relative to the connecting column, the position adjusting mechanism can adjust an axial relative position between the positioning sleeve and the connecting column; and a receiving recess and a locking member, the receiving recess being disposed on the rear box body, the positioning sleeve being disposed in the receiving recess, and the locking member being disposed on the rear box body and located between the receiving recess and the positioning sleeve, wherein when the locking member fits the positioning sleeve, the locking member limits the circumferential rotation and axial movement of the positioning sleeve in the receiving recess, and when the locking member is separated from the positioning sleeve, the positioning sleeve can be disengaged from the receiving recess.

2. The LED display device as claimed in claim 1, wherein a side wall of the receiving recess is provided with a first mounting through hole, an outer side wall of the positioning sleeve is provided with a positioning groove, the locking member comprises a locking pin, and the locking pin passes through the first mounting through hole and then is clamped in the positioning groove.

3. The LED display device as claimed in claim 2, wherein the positioning groove extends along the circumference of the positioning sleeve.

4. The LED display device as claimed in claim 1, wherein the position adjusting mechanism comprises a first screw thread section disposed on the connecting column and a second screw thread section disposed on an inner side wall of the positioning sleeve.

5. The LED display device as claimed in claim 1, wherein the first connecting structure further comprises:

a fixed plate, fixedly disposed on the front box body, the fixed plate being provided with a second mounting through hole; and a rotating head, the rotating head being located on a side, away from the rear box body, of the fixed plate, the rotating head having a reducing section, the reducing section being inserted into the second mounting through hole, and the rotating head being provided with a magnetic member, where the connecting column is provided with a positioning convex edge, the connecting column is connected to the reducing section, and the positioning convex edge is clamped on a side, facing the rear box body, of the fixed plate.

6. The LED display device as claimed in claim 1, wherein a first magnetic attraction mechanism is disposed between the positioning sleeve and the receiving recess.

7. The LED display device as claimed in claim 1, further comprising an adjusting frame, wherein the rear box body is detachably disposed on the adjusting frame, and a horizontal position adjusting mechanism and a vertical position adjusting mechanism are disposed between the adjusting frame and the rear box body.

8. The LED display device as claimed in claim 7, wherein the horizontal position adjusting mechanism comprises:

a first adjusting hole, disposed on a side of the rear box body;

a second adjusting hole, disposed on a side of the adjusting frame, the second adjusting hole being a threaded hole, and the second adjusting hole being located inside the first adjusting hole; and a first adjusting bolt, inserted into the first adjusting hole and the second adjusting hole, where the first adjusting hole is a long hole extending in a width direction of the rear box body.

9. The LED display device as claimed in claim 7, wherein the vertical position adjusting mechanism comprises:

a third adjusting hole, disposed on an upper edge of the rear box body; and a second adjusting bolt, the second adjusting bolt being inserted into the third adjusting hole, and the lower end of the second adjusting bolt urging against the adjusting frame.

10. The LED display device as claimed in claim 7, wherein a second connecting structure is disposed between the adjusting frame and the rear box body.

11. The LED display device as claimed in claim 10, wherein the second connecting structure comprises:

a first connecting hole, disposed on the rear box body, the first connecting hole being a threaded hole;

a second connecting hole, disposed on the adjusting frame; and a connecting bolt, inserted into the first connecting hole and the second connecting hole, where the diameter of the second connecting hole is greater than the diameter of the first connecting hole.

12. The LED display device as claimed in claim 7, wherein a second magnetic attraction mechanism is disposed between the rear box body and the adjusting frame.

* * * * *